United States Patent [19]
Knop

[11] 4,082,453
[45] Apr. 4, 1978

[54] FABRICATION OF RECTANGULAR RELIEF PROFILES IN PHOTORESIST
[75] Inventor: Karl Knop, Zurich, Switzerland
[73] Assignee: RCA Corporation, New York, N.Y.
[21] Appl. No.: 694,374
[22] Filed: Jun. 9, 1976
[30] Foreign Application Priority Data
May 26, 1976 United Kingdom ............ 03085/76
[51] Int. Cl.² .............. G02B 27/38; G03C 5/04; G03B 27/04; G03B 27/02
[52] U.S. Cl. ............................. 355/88; 96/36; 350/162 SF; 355/132
[58] Field of Search ............ 350/162 R, 162 SF, 314, 350/317; 156/659; 96/36, 116, 118; 355/71, 77, 88, 125, 132, 133

[56] References Cited
U.S. PATENT DOCUMENTS

| 3,536,402 | 10/1970 | Aston .................. 355/71 X |
| 3,669,673 | 6/1972 | Sen Ih et al. ........... 350/162 R X |
| 3,697,178 | 10/1972 | Douglas ................ 355/77 |
| 3,891,300 | 6/1975 | Tsunoda ............... 350/162 SF X |
| 3,892,473 | 7/1975 | Ando et al. ........... 350/162 R |
| 3,936,301 | 2/1976 | Schneider ............. 96/36 |
| 3,945,825 | 3/1976 | Gale et al. ............ 96/36 X |
| 3,957,354 | 5/1976 | Knop ................. 350/162 SF |
| 4,009,939 | 3/1977 | Okano ............... 350/162 SF |

FOREIGN PATENT DOCUMENTS

| 1,554,267 | 12/1968 | France ................. 96/36 |
| 2,272,405 | 12/1975 | France ................. 96/36 |

Primary Examiner—Donald Griffin
Attorney, Agent, or Firm—H. Christoffersen; Samuel Cohen; George J. Seligsohn

[57] ABSTRACT

By providing a given thickness for a positive photoresist layer on a substrate which, if unexposed, after development has a maximum depth just equal to the sum of the individual depths of two, at least partly superimposed, rectangular relief-profile diffraction gratings in the developed photoresist layer, it is possible to make a single master recording, which can be used to provide a stamper for embossing two of the three primary colors in a single surface of a transparent plastic sheet in the fabrication of diffractive subtractive filters.

6 Claims, 8 Drawing Figures

FABRICATION OF RECTANGULAR RELIEF PROFILES IN PHOTORESIST

The present invention relates to the fabrication of rectangular relief profiles in photoresist and, more particularly, to a fabrication method for diffractive subtractive color filters.

Reference is made to U.S. Pat. No. 3,957,354, issued May 18, 1976 to Knop and assigned to the same assignee as the present invention, which discloses a diffractive subtractive color filtering technique. As disclosed in U.S. Pat. No. 3,957,354, a diffractive structure comprising a rectangular relief profile embossed in the surface of a transparent medium, such as plastic, may operate as a subtractive color filter responsive to polychromatic (e.g. white) illuminating light for deriving zero diffraction order light of a predetermined subtractive primary color. More specifically, for any given medium having a known index of refraction, the zero-diffraction order of such a filter is determined by the amplitude (depth) of the rectangular relief profile. Thus, a first specified amplitude corresponds to cyan; a second specified amplitude corresponds to yellow and a third specified amplitude corresponds to magenta. Other desired color hues can be obtained by superimposing any two of three diffractive structures having respectively the aforesaid first, second and third specified amplitudes. White is manifested by the absence of any diffractive structure and black by the superposition of all three diffractive structures.

A straight-forward way of physically preparing subtractive color filters manifesting color pictures, which is described in U.S. Pat. No. 3,957,354, is the use of a color-separation negative, corresponding to a predetermined primary color of a given color scene, together with a square-wave grating to produce a relief pattern in a positive photoresist layer corresponding to the predetermined primary color. For example, a thin glass substrate, similar to a microscope slide, may be coated with a layer of positive photoresist having a predetermined thickness. This predetermined thickness is calculated to have a value such that, after exposure to light and development thereof to remove all the photoresist from the glass substrate from solely those areas which have been exposed to light, the depth of the developed unexposed photoresist has a value which just corresponds to the specified amplitude of the predetermined primary color. Preferably, this exposure is made by contact printing the color-separation negative through a chrome-on-glass diffraction grating. In this manner, three separate photoresist recordings may be prepared which respectively manifest each of the three primary colors, with the diffraction grating in each of the three recordings either having a different line spacing and/or having a different angular displacement (such as 60°) relative to each other with reference to the given color scene to prevent the generation of intermodulation components. By placing the three recordings in serial relation and in proper registration with each other, a subtractive color filter manifesting a color picture of the color scene is derived.

In practice, the photoresist recording is normally not used directly, but is used as a master recording for making a metal stamper for embossing a replica of the relief pattern in the surface of a transparent medium, such as a sheet of plastic. The subtractive color filter is then derived by a properly-registered sandwich of three plastic replicas, each respectively manifesting a different one of the three primary colors of the given scene.

The manufacture of diffractive subtractive color filters in embossed plastic could be simplified if it were possible to simultaneously press two of the three primary color diffractive structures on the same one face of a plastic sheet, while impressing the third of the three diffractive structures on the opposite face of the same plastic sheet or, alternatively, on a face of a second sheet. However, this means that the impressed one face of the first-mentioned plastic sheet must have a depth equal to the first specified amplitude in those regions thereof where only the first diffractive structure is present; a depth equal to the second specified amplitude in those regions thereof where only the second diffractive structure is present, and a depth equal to the sum of the first and second specified amplitudes in those regions thereof where the first and second diffractive structures are superimposed. Further, it is essential that any error in the value of these three respective depths be no greater than a few percent, since the color characteristics of the diffractive subtractive filter are determined by the absolute value of these depths. However, a non-linear relationship exists between the developed depth of a photoresist and the total amount of exposure it has experienced. Therefore, the developed depth of a region thereof in which the first and second diffractive structures are superimposed turns out to be substantially greater than the sum of the first and second specified amplitudes.

In accordance with the principles of the present invention, this problem is solved by providing a value for the total original thickness of the layer of photoresist which, when unexposed, after development just equals the sum of the first and second specified amplitudes.

This and other features and advantages of the present invention will become more apparent from the following detailed description taken together with the accompanying drawing, in which:

FIG. 1 shows a typical rectangular relief profile;

FIG. 2a schematically shows the illumination of a thick layer photoresist illuminated through a grating mask with an illuminating beam normal to the surface of the photoresist, and FIG. 2b shows the corresponding developed waveform in the photoresist.

Figure 5:
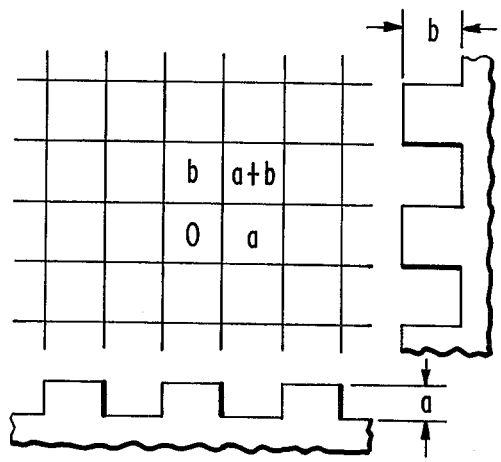
Figure 6:
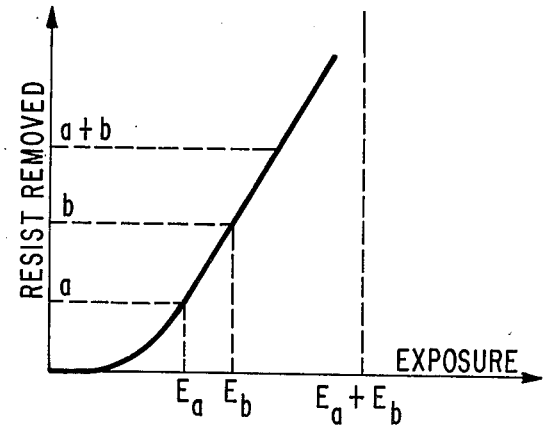

FIG. 5 graphically shows each of the four possible depths in the surface of a photoresist corresponding to the presence of neither, either or both of two angularly-disposed diffractive structures each having a different specified depth, and FIG. 6 is a graph showing the non-linear relationship between the photoresist removed during development as a function of the amount of exposure of a typical photoresist.

Figure 1:
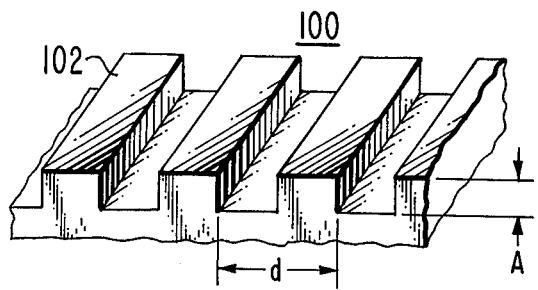

Referring now to FIG. 1, there is shown rectangular-profile diffractive grating 100 of the type of which a diffractive subtractive color filter is comprised. Although in principle diffraction grating 100 may comprise a reflective medium, in practice it normally comprises a transmissive medium 102, such as plastic, exhibiting the predetermined difference in index of refraction $an$ with respect to its surroundings, such as air. By way of example, a typical plastic medium 102, such as polyvinyl chloride, exhibits a value $an$ of about 0.5. The color hue exhibited by the zero diffraction order is determined by the ratio of the absolute value of the depth A to $an$. For instance, with a value of $an = 0.5$, the color of the zero diffraction order light varied with the absolute value of depth A is shown in Table 1.

Table 1

| depth A (in μm) | Color |
| --- | --- |
| 0.50 | dark brown |
| 0.53 | dark magenta |
| 0.60 | blue |
| 1.0 | greenish blue |
| 1.4 | yellow |
| 1.6 | magenta |
| 1.8 | cyan |
| 2.1 | yellowish green |

Thus, as shown in Table 1, the absolute value of depth A is quite small, ranging from one-half micrometer to 2.1 micrometers. The value of the line spacing $d$ of diffraction grating 100 is also quite small. In order to ensure that all diffraction orders are deflected beyond the aperture of the projection lens of nearly all conventional projectors, a value of 2.8 micrometers or smaller for line spacing $d$ is desirable, although a value up to 5 micrometers can normally be tolerated without excessive degradation in the color characteristics of the zero diffraction order light. However, the absolute value of the depth A for any given color light must be maintained within a few percent in order to avoid observable variations in color hue. In addition, only a small error in the desired rectangular profile waveform of diffraction grating 100 can be tolerated.

In the fabrication of diffraction gratings, such as diffraction grating 100, embossed in the surface of a plastic medium, it is conventional to prepare a master recording of the grating in a layer of photoresist on a substrate. A metal stamper made from this master recording can then be used to emboss diffraction gratings in the surface of the plastic medium. The present invention is directed to techniques for fabricating master recordings of rectangular-profile waveform diffracting gratings in a layer of photoresist, which techniques are particularly suitable for producing two diffraction gratings of different depths, whch may be at least partially superimposed, in the same layer of photoresist. The two gratings may have different line spacings and/or be angularly spaced with respect to each other in order to prevent the generation of unwanted intermodulation components.

In the following discussion, the respective terms "thick" photoresist and "thin" photoresist are employed. As used herein, the term "thick" photoresist means a layer of photoresist having a thickness which is substantially greater than the value A of a diffractive structure, while the term "thin" photoresist means layer of photoresist having a total thickness, after development, for unexposed regions thereof just equal to depth A of a diffractive structure. The aforesaid U.S. Pat. No. 3,957,354 discloses the preparation of a diffractive structure comprising a single diffraction grating, of the type shown in FIG. 1, in a "thin" layer of photoresist. The present invention is directed to the solution of the problem of recording in a layer of photoresist a diffractive structure which may consist of two rectangular-profile diffraction gratings of different depths, which at least in part are superimposed. This, of necessity, involves the recording of each respective one of the two diffraction gratings in a "thick" layer of photoresist, rather than a "thin" layer of photoresist.

Figure 2A:
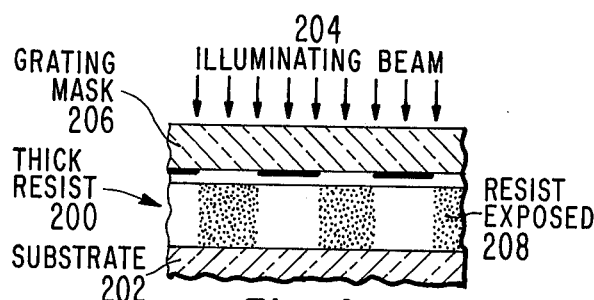
Figure 2B:
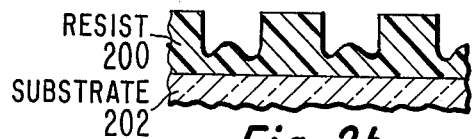

FIG. 2a shows a straightforward approach to recording a diffraction grating of given depth in a layer of thick photoresist. More specifically, as shown in FIG. 2a, thick layer of photoresist 200, supported by substrate 202, which may be glass, is exposed for a given time to light from illuminating beam 204, which is applied in a direction normal to the surface of thick photoresist 200 through a chrome-on-glass printing mask 206 in contact with the surface of thick photoresist 200. The total exposure time of illuminating beam 204 is made proportional to the desired depth A of the grating to be recorded in the developed photoresist. As shown in FIG. 2a, the cross sectional dimension of the exposed photoresist 208 corresponding to each individual opening of grating mask 206 remains substantially constant through the entire thickness of thick photoresist 200 because illuminating beam 204 has a direction which is normal to the surface of thick photoresist 200. It would appear, therefore, that a sharp edged rectangular profile diffraction grating would result in the developed photoresist. However, as shown in FIG. 2b, this is not the case. Instead, because of diffractive effects on the wave energy of illuminating beam 204, the exposure is not uniform throughout the region of thick photoresist 200 covered by each individual opening of grating mask 206. Therefore, when the layer of thick photoresist 200 is developed, the distorted ¢W-like" waveform profile shown in FIG. 2b is obtained, rather than the desired substantially rectangular waveform profile. These undesirable diffraction effects take place because the diffraction grating line spacing $d$ is comparable to the wavelength of the light of illuminating beam 204, which, by way of example, may be ultraviolet light obtained from a mercury lamp.

Figure 3A:
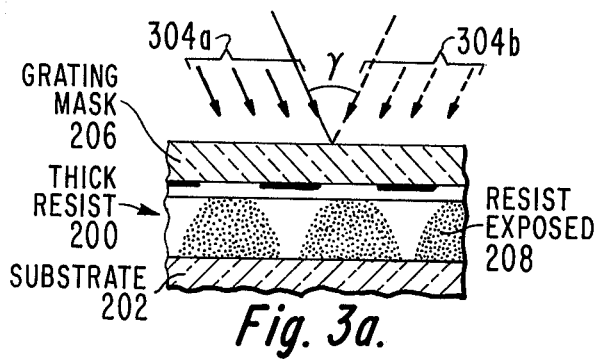
FIG. 3a shows the illumination of a thick photoresist to a grating mask with an illumination beam which includes light which is obliquely inclined with respect to the surface of the fixed photoresist.
Figure 3B:
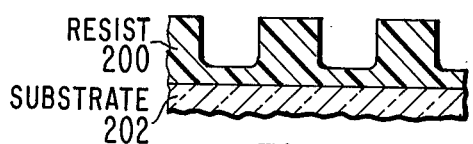
FIG. 3b shows the corresponding developed waveform in the photoresist.

However, a substantially rectangular waveform profile may be obtained by appropriately varying the direction of the beam of illuminating light. More specifically, as shown in FIG. 3a, the illuminating beam of light, which has an initial direction indicated by reference numeral 3a inclined at a certain dihedral oblique angular position on one side of the normal to the surface of thick photoresist 200, is rotated during exposure about an axis parallel to a grating line through a well defined angle $\gamma$ to a final direction indicated by reference numeral 304b which is inclined at the certain dihedral oblique angular position on the other side of the normal to the surface of thick photoresist 200. Alternatively, a stationary beam which has been correspondingly decollimated could be used instead of a rotating beam. In any case, there results an average exposure 208 which gives the essentially rectangular waveform profile shown in FIG. 3b. The value of the angle $\gamma$ must be adjusted in accordance with the respective values to $d$ and A of the grating to be recorded. For example, an optimum angle of about 50° was found where the case where $d = 5$ μm and A was in the range of 1.1 to 1.7 μm.

Figure 4:
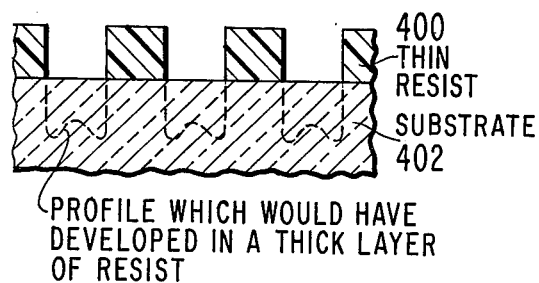
FIG. 4 shows the developed waveform in a thin photoresist.

FIG. 4 shows that in the case of a thin photoresist layer, rather than a thick photoresist layer, a normal illuminating beam similar to illuminating beam 204 in FIG. 2a, can be used, since the total thickness of the developed photoresist is made just equal to the desired value of depth A. In particular, as shown in FIG. 4, the bottoms of the rectangular waveform profile in thin photoresist 400 extend all the way to the surface of substrate 402, so that the "W-like" waveform profile (shown in phantom in FIG. 4) which would have developed in a thick layer of photoresist is inherently absent in a thin layer photoresist. Of course, the more complicated exposure approach shown in FIG. 3a could, if desired, also be employed with a thin photoresist.

FIG. 5 is a schematic diagram showing the relief pattern formed by two, superimposed diffraction gratings, each having a different depth. For simplicity's sake, an angular displacement of 90° is shown. However, the angular displacement may be 60°, 90° or any other selected value or, alternatively, the two diffraction gratings could have different line spacings. In any case, the superposition of a first diffraction grating having a depth $a$ and a second diffraction grating having a different depth $b$ results in the relief pattern exhibiting any one of four different levels; namely, zero, $a$, $b$ and $(a+b)$ as shown in FIG. 5.

Using the illuminating approach shown in FIG. 3a, a first exposure of a positive photoresist layer may be made through a grating mask 306 which first exposure is proportional to depth $a$. Then, grating mask 206 may be angularly displaced by the proper amount, such as 90°, and a second exposure made by the illuminating approach shown in FIG. 3a, which second exposure is proportional to depth $b$. After both exposures have been made, the photoresist layer may be developed to produce two, angularly displaced superimposed diffraction gratings. Since the photoresist layer is a positive photoresist, regions thereof which remained unexposed during both the first exposure and the second exposure will, after development, exhibit a zero depth; regions thereof which were exposed during the first exposure, but remained unexposed during the second exposure, will exhibit a depth $a$ and regions thereof which remained unexposed during the first exposure but were exposed at the second exposure will exhibit a depth $b$. However, in general, regions of the photoresist layer which were exposed both during the fist exposure and the second exposure will not exhibit the desired depth $(a+b)$, but will exhibit a depth substantially greater than $(a+b)$. The reason for this, shown in FIG. 6, is that the photoresist layer exhibits a non-linear characteristic with respect to total exposure, causing the developed depth in a "thick" layer of photoresist corresponding to an exposure of $(a+b)$ to be substantially greater than $(a+b)$.

However, by preadjusting the thickness of the photoresist layer to the desired depth $(a+b)$ to provide a "thin[ photoresist layer for the depth $(a+b)$, as described in connection with FIG. 4, while still providing a "thick" photoresist layer for the $a$ depth alone or the $b$ depth alone, each of the four proper depths, 0, $a$, $b$ and $(a+b)$ is obtainable. In particular, the thickness of the original photoresist layer can be selected within a few percent during spin-coating thereof by adjusting the spinning speed in the composition of the original photoresist mixture. By way of example, the composition of the original photoresist mixture may be made up of five portions of Shipley AZ1350-H photoresist diluted with one portion of No. 2-Butyloxy-Ethanol and spun at a selected speed within the range of 1,000 to 2,500 revolutions/minute.

Employing the technique of the present invention, it is possible to accurately mix any two of the three primary colors in a single surface diffractive subtractive filter because the number of adjustable parameters in making the master recording in the positive photoresist layer is exactly three (the thickness $(a+b)$, the first exposure time $E_a$ and the second exposure time $E_b$), which is just sufficient for superimposing two gratings. This method cannot be expanded to three superimposed grating structures, required for mixing all three primary colors on a single surface of a diffractive subtractive filter, because eight different levels are required, but only four parameters are available (a photoresist layer thickness $(a+b+c)$ and exposure times $E_a$, $E_b$ and $E_c$). However, the present invention makes it possible to emboss one of the two opposite surfaces of a diffractive subtractive filter with two gratings manifesting two of the three primary colors while embossing the other of the opposite surfaces with a single grating manifesting the remaining one of the three primary colors.

What is claimed is:

1. In a master recording for use to form a stamper for embossing two of three subtractive primary colors in a single surface of a transparent plastic sheet in the fabrication of diffractive, subtractive filters, said master recording comprising a substrate supporting a developed photoresist layer which layer has a given maximum thickness; said layer defining a predetermined rectangular relief-profile diffractive structure, the improvement;

wherein said diffractive structure comprises a first diffraction grating having a first given depth corresponding to a first of said two primary colors of zero-order diffraction light and a second diffraction grating having a second given depth different from said first given depth corresponding to a second of said two primary colors of zero-order diffraction light, said second diffraction grating being at least partly superimposed on said first diffraction grating, and wherein said given maximum thickness of said developed photoresist layer is equal to the sum of said first and second given depths and the thickness of said developed photoresist at any point on the master recording is equal to the sum of the depths of the superimposed diffraction gratings at that point.

2. In a method for making a master recording for use to form a stamper for embossing two of three subtractive primary colors in a single surface of a transparent plastic sheet in the fabrication of diffractive, subtractive filters, the improvement comprising the steps of:

exposing the surface of a layer of photoresist of a preselected thickness supported by a substrate to a first given amount of light spatially distributed in a first pattern to provide, upon development of said photoresist, a first rectangular relief-profile diffraction grating having a first given depth corresponding to a first of said two primary colors of zero-order diffraction light, and then exposing the surface of said layer of photoresist to a second given amount of light spatially distributed in a second pattern which is at least partly superimposed on said first pattern to provide, upon development of said photoresist, a second rectangular relief-profile diffraction grating having a second given depth different from said first given depth corresponding to a second of said two primary colors of zero-order diffraction light, said preselected thickness having that value which results in the maximum thickness of said layer of photoresist after development being equal to the sum of said first and second depths and the thickness of said developed photoresist at any point on the master recording being equal to the sum of the depths of the superimposed diffraction gratings at that point.

3. The improved method defined in claim 2, comprising the step of developing said photoresist after said second-mentioned exposure thereof.

4. The improved method of claim 2, comprising the step of spin-coating said substrate with a layer of photoresist of said preselected thickness prior to said first-mentioned exposure thereof.

5. The improved method defined in claim 2,
wherein each of said steps of exposure comprise the step of illuminating said layer through an amplitude diffraction grating means in contact with said layer with decollimated light lying within a dihedral angle having an axis parallel to a line of said amplitude diffraction grating means, said dihedral angle extending from a certain oblique angular value on one side of the normal to the surface of said layer to substantially said certain oblique angular value on the other side of the normal to the surface of said layer.

6. The improved method defined in claim 5, wherein the step of illuminating comprises the step of rotating an illuminating beam of light during exposure about an axis parallel to a line of said amplitude diffraction grating means from said certain oblique angular value on said one side to substantially said certain oblique angular value on said other side.

* * * * *

UNITED STATES PATENT OFFICE
CERTIFICATE OF CORRECTION

Patent No. 4,082,453　　　　　　　　　　Dated April 4, 1978

Inventor(s) Karl Knop

It is certified that error appears in the above-identified patent and that said Letters Patent are hereby corrected as shown below:

```
Column 2, line 48, "illumination" should read --illuminating--
Column 3, line 3 , "a" should read --Δ--
Column 3, line 5 , "a" should read --Δ--
Column 3, line 8 , "a" should read --Δ--
Column 3, line 8 , "a" should read --Δ--
Column 3, line 48, "whch" should read --which--
Column 4, line 32, "fW-like"" should read --"W-like"--
Column 4, line 56, "208" should read --308--
Column 5, line 17, "a" should read --a--
Column 5, line 24 "a" should read --a--
Column 5, line 37 "a" should read --a--
Column 5, line 41 "fist" should read --first--
Column 5, line 52,""thin[" should read --"thin"--
Column 5, line 54 "a" should read --a--
```

Signed and Sealed this

Twenty-sixth Day of December 1978

[SEAL]

Attest:

RUTH C. MASON　　　　　　　　DONALD W. BANNER
Attesting Officer　　　　　　Commissioner of Patents and Trademarks